United States Patent
Lee et al.

(10) Patent No.: US 9,966,660 B2
(45) Date of Patent: May 8, 2018

(54) ELECTROMAGNETIC WAVE SHIELDING SHEET, MANUFACTURING METHOD THEREOF, AND BUILT-IN ANTENNA HAVING THE SAME

(71) Applicant: AMOGREENTECH CO., LTD., Gimpo-si (KR)

(72) Inventors: Seung Hoon Lee, Goyang-si (KR); Yong Sik Jung, Namyangju-si (KR); Yun Mi So, Daejeon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 453 days.

(21) Appl. No.: 14/560,209

(22) Filed: Dec. 4, 2014

(65) Prior Publication Data

US 2015/0084825 A1 Mar. 26, 2015

Related U.S. Application Data

(62) Division of application No. PCT/KR2013/004652, filed on May 28, 2013.

(30) Foreign Application Priority Data

Jun. 4, 2012 (KR) .................. 10-2012-0059901

(51) Int. Cl.
*H05K 9/00* (2006.01)
*H01Q 1/52* (2006.01)
*B32B 37/15* (2006.01)

(52) U.S. Cl.
CPC ............ *H01Q 1/526* (2013.01); *B32B 37/15* (2013.01); *H05K 9/009* (2013.01); *H05K 9/0081* (2013.01);
(Continued)

(58) Field of Classification Search
CPC ................ H01Q 1/526; H05K 9/00
(Continued)

(56) References Cited

U.S. PATENT DOCUMENTS

| 6,455,770 B2 * | 9/2002 | Pulver ............. H01L 23/552 |
| | | 174/394 |
| 6,768,654 B2 * | 7/2004 | Arnold ........... B29C 45/14811 |
| | | 174/394 |

(Continued)

FOREIGN PATENT DOCUMENTS

| JP | 10217181 | 8/1998 |
| JP | 2007143132 | 6/2007 |

(Continued)

OTHER PUBLICATIONS

International Search Report—PCT/KR2013/004652 dated Sep. 12, 2013.

*Primary Examiner* — Dameon E Levi
*Assistant Examiner* — Hasan Islam
(74) *Attorney, Agent, or Firm* — Cantor Colburn LLP (57) ABSTRACT

Provided is an electromagnetic wave shielding sheet including: a substrate that is formed in a nano-web form by spinning a polymer material into fiber strands by a spinning method; a conductive metal layer that is formed on one surface of the substrate for shielding electromagnetic waves; and an adhesive layer formed on the other surface of the substrate, to thereby make a thickness of the electromagnetic wave shielding sheet thin, and improve electromagnetic wave shielding performance.

10 Claims, 5 Drawing Sheets

(52) U.S. Cl.
CPC ......... *H05K 9/0084* (2013.01); *H05K 9/0088* (2013.01)

(58) Field of Classification Search
USPC .......................... 343/841; 361/818, 800, 816
See application file for complete search history.

(56) References Cited

U.S. PATENT DOCUMENTS

| | | | |
|---|---|---|---|
| 8,716,606 B2* | 5/2014 | Kelley | H01L 23/573 174/382 |
| 2003/0007341 A1* | 1/2003 | Shimamura | H01J 5/08 361/816 |
| 2007/0252771 A1* | 11/2007 | Maezawa | G06K 19/07771 343/841 |
| 2008/0292891 A1* | 11/2008 | Tsutagaya | B32B 27/08 428/457 |
| 2012/0247868 A1 | 10/2012 | Kato et al. | |

FOREIGN PATENT DOCUMENTS

| | | |
|---|---|---|
| JP | 2009188298 | 8/2009 |
| JP | 2011146696 | 7/2011 |
| JP | 2011181714 | 9/2011 |
| KR | 1020090078620 | 7/2009 |

* cited by examiner

FIG. 10 ial Application No. PCT/KR2013/004652 filed on May 28, 2013, which claims priority to and the benefit of Korean Application No. 10-2012-0059901 filed on Jun. 4, 2012, in the Korean Patent Office, the entire contents of which are incorporated herein by reference.

TECHNICAL FIELD

The present invention relates to an electromagnetic wave shielding sheet in which a conductive metal layer is formed on a surface of a substrate made in a nano-web form by using a spinning method, to thereby make a thickness of the electromagnetic wave shielding sheet thin, and improve electromagnetic wave shielding performance, a method of manufacturing the same, and a built-in antenna having the same.

BACKGROUND ART

Recently, portable electronic devices and electronic devices for displays tend to be light, thin, short, and compact, speedily, signal transfer speeds between components in the electronic devices become high, and circuit boards are in progress with high-integration microcircuits, to thereby have a tendency of increasing damage of EMI (Electromagnetic Interference) of signals due to electromagnetic noise generated between the adjacent circuits.

In addition, if electromagnetic waves generated from electronic devices are exposed to the human body for a long time, the human body may suffer from disorder such as glaucoma, and lowering of fertility.

Accordingly, in order to block electromagnetic waves, the portable electronic devices and electronic devices for displays, mainly use a type of shielding electromagnetic waves by attaching electromagnetic wave shielding sheets onto the inner surface of a case, circuit components that directly generate electromagnetic waves, or the surface of a built-in antenna.

As disclosed in Korean Patent Application Publication No. 10-2009-0078620, on Jul. 20, 2009, a conventional electromagnetic wave shielding sheet includes: a substrate sheet formed of a synthetic resin film; and a metal deposition layer that is sputtered on the surface of the substrate sheet, wherein the metal deposition layer is made of at least one selected from the group consisting of copper (Cu), nickel (Ni), zinc (Zn), aluminum (Al) and manganese (Mn).

However, the conventional electromagnetic wave shielding sheet becomes thick since the substrate sheet is formed of a synthetic resin film, and thus the overall thickness of a portable electronic device using the conventional electromagnetic wave shielding sheet is increased.

Further, when depositing a conductive metal on the surface of the synthetic resin film, the conductive metal layer may cause peeling to thereby cause a problem of degrading electromagnetic wave shielding performance.

SUMMARY OF THE INVENTION

To solve the above problems or defects, it is an object of the present invention to provide an electromagnetic wave shielding sheet that is formed by making a substrate in a nano-web form by using a spinning method, to thereby make a thickness of the electromagnetic wave shielding sheet thin, and a method of manufacturing the same.

It is another object of the present invention to provide an electromagnetic wave shielding sheet in which a conductive metal layer is formed on a surface of a substrate or non-porous spinning film made by using a spinning method, to thereby prevent the conductive metal layer from being peeled off and improve electromagnetic wave shielding performance, and a method of manufacturing the same.

It is still another object of the present invention to provide a built-in antenna that is formed integrally with an electromagnetic wave shielding sheet, to thereby make a thickness of the electromagnetic wave shielding sheet thin, and improve electromagnetic wave shielding performance.

The technical problems to be solved in the present invention are not limited to the above-mentioned technical problems, and the other technical problems that are not mentioned in the present invention may be apparently understood by one of ordinary skill in the art to which the present invention belongs.

To accomplish the above and other objects of the present invention, according to an aspect of the present invention, there is provided an electromagnetic wave shielding sheet comprising: a substrate that is formed in a nano-web form by spinning a polymer material into fiber strands by a spinning method; a conductive metal layer that is formed on one surface of the substrate for shielding electromagnetic waves; and an adhesive layer formed on the other surface of the substrate.

According to another aspect of the present invention, there is provided an electromagnetic wave shielding sheet comprising: a substrate that is formed in a nano-web form by spinning a polymer material into fiber strands by a spinning method; a conductive metal layer that is formed on one surface of the substrate for shielding electromagnetic waves; a non-porous film layer formed on the other surface of the substrate; and an adhesive layer formed on the non-porous film layer.

According to another aspect of the present invention, there is provided an electromagnetic wave shielding sheet comprising: a first substrate that is formed in a nano-web form by spinning a polymer material into fiber strands by a spinning method; a conductive metal layer that is formed on one surface of the first substrate for shielding electromagnetic waves; a non-porous film layer formed on the other surface of the first substrate; a second substrate formed on the non-porous film layer; and an adhesive layer formed on the second substrate.

According to another aspect of the present invention, there is provided an electromagnetic wave shielding sheet comprising: a first substrate that is formed in a nano-web form by spinning a polymer material into fiber strands by a spinning method; a conductive metal layer that is formed on one surface of the first substrate for shielding electromagnetic waves; a non-porous film layer formed on the other surface of the first substrate; and a double-sided tape attached on the non-porous film layer, wherein the double-sided tape is laminated on one surface of the non-porous film layer by a pressing roller.

According to another aspect of the present invention, there is provided an method of manufacturing an electromagnetic wave shielding sheet comprising the steps of: forming an adhesive layer by spinning an adhesive material on a release film; forming a substrate in a nano-web form by spinning a polymer material on the adhesive layer; and forming a conductive metal layer on one surface of the substrate.

According to another aspect of the present invention, there is provided a method of manufacturing an electromagnetic wave shielding sheet comprising the steps of: forming an adhesive layer by spinning an adhesive material on a release film; forming a non-porous film layer by spinning a polymer material containing PU (polyurethane) or TPU (thermoplastic polyurethane) on the adhesive layer; forming a substrate in a nano-web form by spinning the polymer material on the non-porous film layer; and forming a conductive metal layer on the substrate.

According to another aspect of the present invention, there is provided a method of manufacturing an electromagnetic wave shielding sheet comprising the steps of: forming an adhesive layer by spinning an adhesive material on a release film; forming a first substrate in a nano-web form by spinning a polymer material on the surface of the adhesive layer; forming a non-porous film layer by spinning a polymer material containing PU (polyurethane) or TPU (thermoplastic polyurethane) on the first substrate; forming a second substrate in a nano-web form by spinning the polymer material on the surface of the non-porous film layer; and forming a conductive metal layer on the second substrate.

According to another aspect of the present invention, there is provided a method of manufacturing an electromagnetic wave shielding sheet comprising the steps of: preparing a base film; forming a substrate in a nano-web form by spinning a polymer material on one surface of the base film; forming an adhesive layer by spinning an adhesive material on the other surface of the base film; and forming a conductive metal layer on the substrate.

According to another aspect of the present invention, there is provided a method of manufacturing an electromagnetic wave shielding sheet comprising the steps of: forming a non-porous film layer by spinning a polymer material containing PU (polyurethane) or TPU (thermoplastic polyurethane); forming a first substrate in a nano-web form by spinning a polymer material on one surface of the non-porous film layer; forming a conductive metal layer on the first substrate; and laminating a double-sided tape on the other surface of the non-porous film layer.

According to another aspect of the present invention, there is provided a built-in antenna comprising: a FPCB (flexible printed circuit board) in which an antenna pattern formed; a ferrite sheet that is stacked on the FPCB; and an electromagnetic wave shielding sheet that is laminated on the ferrite sheet.

As described above, the electromagnetic wave shielding sheet according to the present invention is manufactured by forming a substrate in a nano-web form having a plurality of pores by using a spinning method, to thereby make a thickness of the electromagnetic wave shielding sheet thin.

In addition, the electromagnetic shielding sheet according to the present invention is manufactured by forming a conductive metal layer on the surface of a substrate or non-porous spinning film, to thereby prevent a phenomenon that the conductive metal layer is peeled off and improve electromagnetic wave shielding performance.

In addition, the built-in antenna according to the present invention can be integrally formed with the electromagnetic wave shielding sheet that can be made thinly and improve electromagnetic wave shielding performance.

DETAILED DESCRIPTION OF THE INVENTION

Embodiments of the present invention will be described below in detail with reference to the accompanying drawings. Here, the size or shape of the components illustrated in the drawings may be shown to be exaggerated for convenience and clarity of illustration. In addition, specifically defined terms may be changed according to the intention or practices of users or operators in consideration of the construction and operation of the present invention. The definition of the terms should be made based on contents throughout the present specification.

Figure 1:
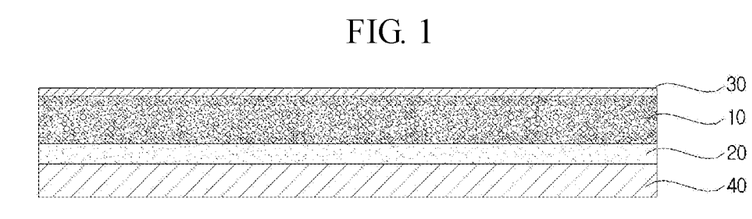
FIG. 1 is a cross-sectional view of an electromagnetic wave shielding sheet according to a first embodiment of the present invention.
Figure 2:
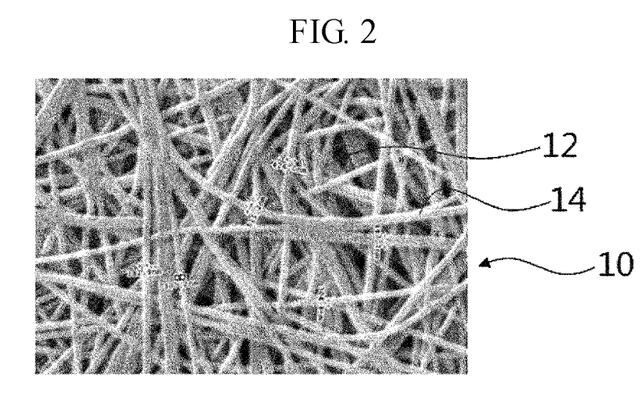
FIG. 2 is an enlarged view of a substrate according to the first embodiment of the present invention.

FIG. 1 is a cross-sectional view of an electromagnetic wave shielding sheet according to a first embodiment of the present invention, and FIG. 2 is an enlarged view of a substrate according to the first embodiment of the present invention.

The electromagnetic wave shielding sheet according to the first embodiment includes: a substrate 10 that is formed in a nano-web form by electrospinning a polymer material into ultra-fine fiber strands and accumulating the ultrafine fiber strands; an adhesive layer 20 that is formed on one surface of the substrate 10; and a conductive metal layer 30 formed on the other surface of the substrate 10.

The substrate 10 is manufactured in a nano-web form having a plurality of pores 12 by making the polymer material into ultra-fine fiber strands 14 by a spinning method, and accumulating the ultrafine fiber strands 14.

Here, the diameter of each of the fiber strands 14 is preferably in the range of 0.1 μm to 3.0 μm.

The spinning method that is applied for the present invention may employ any one of electrospinning, air-electrospinning (AES), electrospray, electrobrown spinning, centrifugal electrospinning, and flash-electrospinning.

That is, any of spinning methods of making ultrafine fiber strands in an accumulated form can be also applied to the substrate 10 and the adhesive layer 20 according to the present invention.

For example, the polymer materials used to make the substrate 10 in the present invention may be: polyvinylidene fluoride (PVdF), poly(vinylidene fluoride-co-hexafluoropropylene), a perfluoropolymer, polyvinyl chloride, polyvinylidene chloride, or a copolymer thereof; a polyethylene glycol derivative containing polyethylene glycol dialkylether and polyethylene glycol dialkylester; poly(oxymethylene-oligo-oxyethylene); polyoxide containing polyethylene oxide and polypropylene oxide; polyvinyl acetate, poly (vinyl pyrrolidone-vinyl acetate), polystyrene, and a polystyrene acrylonitrile copolymer; a polyacrylonitrile copolymer containing polyacrylonitrile (PAN) and a polyacrylonitrile methyl methacrylate copolymer; or polymethyl methacrylate, a poly methyl methacrylate copolymer, or a mixture thereof.

Since the substrate 10 is produced by a spinning method, the thickness of the substrate 10 is determined according to the dose of the electrospun polymer material. Thus, it is advantageously easy to make the thickness of the substrate 10 into a desired thickness. That is, if the dose of the electro spun polymer material is made less, the thickness of the substrate 10 may be made thin, and since the dose of the electrospun polymer material is increased, the thickness of the substrate 10 may be made thick.

In this way, since the substrate 10 is manufactured by a spinning method, thickness of the substrate 10 may be freely adjusted according to the dose of the spun polymer material, and thickness of the electromagnetic wave shielding sheet may be remarkably made thin in comparison with a case where a conventional synthetic resin film or nonwoven fabric is used.

The adhesive layer 20 is manufactured by the same spinning method as that of making the substrate 10. That is, the adhesive layer 20 is created by mixing an adhesive and a solvent to thus make an adhesive material of a viscosity suitable for electrospinning and spinning the adhesive material on a surface of the substrate 10 by the spinning method.

Here, the thickness of the adhesive layer 20 is determined according to the dose of the spun adhesive material. Therefore, the thickness of the adhesive layer 20 can be freely made.

Then, the adhesive layer 20 is spun in the form of ultra-fine fiber strands, and is laminated on the surface of the substrate 10, in which the adhesive material is introduced into the pores 12 of the substrate 10, thereby increasing the adhesion strength between the substrate 10 and the adhesive layer 20.

Further, as the adhesive layer 20 is introduced into the pores of the substrate 10, the amount of the adhesive can be increased. Thus, the adhesive layer 20 may increase the adhesive strength even if the adhesive layer 20 is formed into an identical thickness.

A release film 40 is attached on the surface of the adhesive layer 20 to protect the adhesive layer 20.

The conductive metal layer 30 can be formed on the surface of the substrate 10, for example, by a vapor deposition process such as a sputtering method. The method of forming the conductive metal layer 30 on the surface of the substrate 10 appropriately may employ a chemical vapor deposition method in addition to the sputtering method, or any of various methods of forming the conductive metal layer. Further, there are no particular limitations to metal materials having electrical conductivity such as copper (Cu) and aluminum (Al) that may be used as the metal constituting the conductive metal layer 30.

Thus, since the conductive metal layer 30 is formed on the substrate 10 in the nano-web form as described above, the metal material is introduced into a plurality of the pores 12 contained in the substrate 10, to thus enable a solid bond and prevent the peeling off of the conductive metal layer 30. Therefore, it is possible to improve the electromagnetic wave shielding performance.

Figure 3:
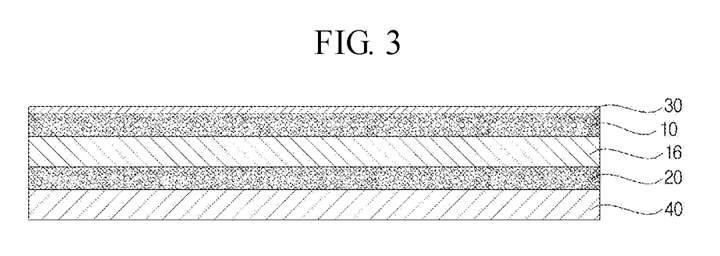
FIG. 3 is a cross-sectional view of an electromagnetic wave shielding sheet according to a second embodiment of the present invention.

FIG. 3 is a cross-sectional view of an electromagnetic wave shielding sheet according to a second embodiment of the present invention.

The electromagnetic wave shielding sheet according to the second embodiment includes: a substrate 10 that is formed in a nano-web form by electrospinning a polymer material into ultra-fine fiber strands and accumulating the ultrafine fiber strands; a conductive metal layer 30 that is formed on one surface of the substrate 10; a non-porous film layer 16 formed on the other surface of the substrate 10; and an adhesive layer 30 that is laminated on the non-porous film layer 16.

Since the substrate 10 and the adhesive layer 20 of the second embodiment are the same as the substrate 10 and the adhesive layer 20 described in the above-described first embodiment, description thereof is omitted.

The non-porous film layer 16 is formed by electrospinning a polymer material containing PU (polyurethane) or TPU (thermoplastic polyurethane) into ultra-fine fiber strands and accumulating the ultrafine fiber strands, in which the PU or TPU is dissolved in a solvent, and is formed in a non-porous shape having no pores without any heat treatment.

That is, the non-porous film layer 16 is made of the polymer material containing a rubber component melted in the solvent such as the PU or TPU. When the polymer material containing a rubber component is electrospun, the rubber component is melted in the solvent and thus the polymer material is formed into a non-porous film having no pores.

Here, the non-porous film layer 16 is laminated on the substrate 10, to thus serve to block the surface of the substrate 10 and to thereby serve to prevent the metal material of the conductive metal layer 30 formed on the substrate 10 from escaping through the pores 12 of the substrate 10, increase the degree of integration of the metal material, and enhance the shielding efficiency.

In addition, when the adhesive layer 20 is laminated directly on the substrate 10, the adhesive material is penetrated into the pores 12 formed on the substrate 10. Accordingly, there is a fear that the strength of the substrate 10 may be weakened, but since the non-porous film layer 16 is laminated between the adhesive layer 20 and the substrate 10, to thus prevent the adhesive material from being penetrated into the pores 12 of the substrate 10, the strength of the substrate 10 can be maintained.

Here, since the adhesive layer 20 is formed on the non-porous film layer 16, there may be a risk to deteriorate the adhesion. In order to increase the viscosity of the adhesive strength of the adhesive layer 20, the adhesive layer 20 is formed of an adhesive material of a low viscosity.

Figure 4:
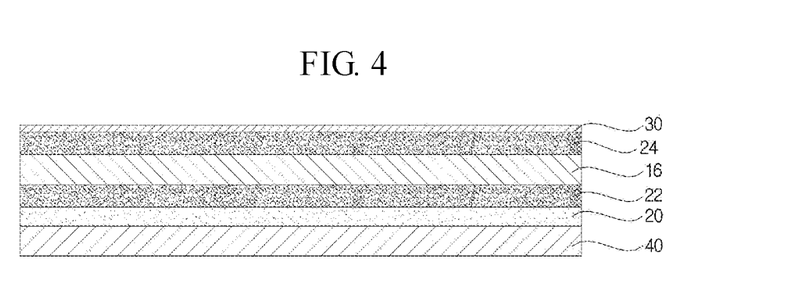
FIG. 4 is a cross-sectional view of an electromagnetic wave shielding sheet according to a third embodiment of the present invention.

FIG. 4 is a cross-sectional view of an electromagnetic wave shielding sheet according to a third embodiment of the present invention.

The electromagnetic wave shielding sheet according to the third embodiment includes: a first substrate 22 that is formed in a nano-web form by electrospinning a polymer material into ultra-thin fiber strands and accumulating the ultra-thin fiber strands; an adhesive layer 20 that is formed on one surface of the first substrate 22; a non-porous film layer 16 formed on the other surface of the first substrate; a second substrate 24 formed on the non-porous film layer 16; and a conductive metal layer 30 formed on the second substrate 24.

The electromagnetic wave shielding sheet according to the third embodiment has a structure that the substrate includes the first substrate 22 and the second substrate 24, and the non-porous film layer 16 is laminated between the first and second substrates 22 and 24.

Since the first and second substrates 22 and 24 and the adhesive layer 20 of the third embodiment are the same as the substrate 10 and the adhesive layer 20 described in the above-described first embodiment, description thereof is omitted.

The non-porous film layer 16 is formed by electrospinning a polymer material containing PU (polyurethane) or TPU (thermoplastic polyurethane) into ultra-fine fiber strands and accumulating the ultrafine fiber strands, in which the PU or TPU is dissolved in a solvent, and is formed in a non-porous shape having no pores without any heat treatment.

In the case of the electromagnetic wave shielding sheet according to the third embodiment, the conductive metal layer 30 is formed on one surface of the second substrate 24 so that the conductive metal material is penetrated into the pores 12 formed on the second substrate 24, to thereby improve a vapor deposition force. In addition, the non-porous film layer 16 is formed on the other surface of the second substrate 24, to thereby serve to prevent the conductive metal material from escaping through the pores 12 of the second substrate 24, increase the degree of integration of the metal material, and enhance the shielding efficiency.

In addition, since the adhesive layer 20 is formed on one surface of the first substrate 22, the adhesive material is penetrated into the pores 12 of the first substrate 22, to thus improve the adhesive strength of the adhesive layer 20. In addition, since the non-porous film layer 16 is formed on the other surface of the first substrate 22, the adhesive material penetrated into the first substrate 22 is prevented from being introduced into the second substrate 24.

In this way, the electromagnetic wave shielding sheet according to the third embodiment has the advantages of increasing the adhesive strength while improving the electromagnetic wave shielding performance.

Figure 5:
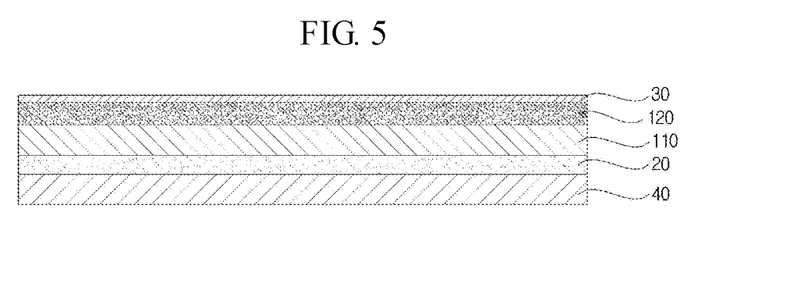
FIG. 5 is a cross-sectional view of an electromagnetic wave shielding sheet according to a fourth embodiment of the present invention.

FIG. 5 is a cross-sectional view of an electromagnetic wave shielding sheet according to a fourth embodiment of the present invention.

The electromagnetic wave shielding sheet in accordance with the fourth embodiment includes: a base film 110 to act as a substrate; a nano-web layer 120 that is formed to have a plurality of pores by electrospinning a polymer material on one surface of the base film 110 into ultra-fine fiber strands and accumulating the ultra-fine fiber strands; a conductive metal layer 30 formed on the nano-web layer 120; and an adhesive layer 20 that is laminated on the other surface of the base film 110.

The base film 110 serves to act as a substrate to maintain the strength of the shielding sheet. Any resin material that allows the nano-web layer 120 to be formed on one surface of the base film 110 by an electrospinning method, and the adhesive layer 20 to be formed on the other surface of the base film 110 can be applied as the material for the base film 110. The base film 110 may be a PET (polyethylene phthalate) film.

The nano-web layer 120 is formed in the same manner as the substrate 10 described in the first embodiment, and has a plurality of pores 12. Then, the adhesive layer 20 may be formed by a spinning method described in the first embodiment, and is also possible to be laminated by a method such as a coating method in addition to the spinning method.

In the case of the electromagnetic wave shielding sheet according to the fourth embodiment, the base film 110 formed of a PET film or the like is used as the substrate, and the nano-web layer 120 is formed on one side of the base film to 110 and the adhesive layer 20 is formed on the other surface of the base film to 110.

The electromagnetic wave shielding sheet may enhance the strength of the electromagnetic wave shielding sheet by the strength of the base film 110. In addition, when the conductive metal layer 30 is formed on the nano-web layer 120, the metal material is blocked by the base film 110, to thus prevent the metal material from escaping through the pores of the nano-web layer 120. In addition, since the adhesive layer 20 is formed on the base film 110, the adhesive material can be prevented from being penetrated into the pores of the nano-web layer 120.

In the case of the electromagnetic wave shielding sheet according to the first to fourth embodiments, both the substrate and the adhesive layer on which the conductive metal layer is respectively formed may be fabricated in a single manufacturing process by using an electrospinning device, or both the substrate and the adhesive layer on which the conductive metal layer is respectively formed may be fabricated in a separate electrospinning device, and thereafter both the substrate and the adhesive layer are laminated in a roll-pressing process, to thereby manufacture the electromagnetic wave shielding sheet.

Figure 6:
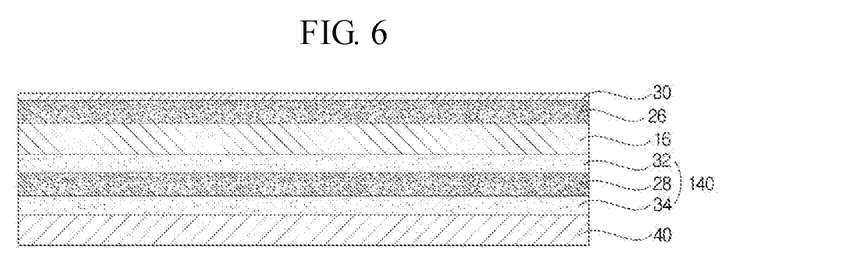
FIG. 6 is a cross-sectional view of an electromagnetic wave shielding sheet according to a fifth embodiment of the present invention.

FIG. 6 is a cross-sectional view of an electromagnetic wave shielding sheet according to a fifth embodiment of the present invention.

The electromagnetic wave shielding sheet according to the fifth embodiment includes: a non-porous film layer 16; a first substrate 26 in a nano-web form that is formed on one surface of the non-porous film layer 16; a conductive metal layer 30 that is formed on the first substrate 26 for playing a role of performing electromagnetic wave shielding performance; and a double-sided tape 140 attached on the other surface of the non-porous film layer 16.

In the case of the electromagnetic wave shielding sheet according to the fifth embodiment, the non-porous film layer 16, the first substrate 26 and the conductive metal layer 30 are integrally formed in a single electrospinning device, the double-sided tape 140 is formed in another electrospinning device, and the double-sided tape is placed on the other surface of the non-porous film layer 16, to thereafter perform lamination by means of a thermal compression bonding method and the like and manufacture the electromagnetic wave shielding sheet.

The non-porous film layer 16 may be produced by the same electrospinning method as described in the second embodiment, or the non-porous film layer 16 may be also replaced by a PET film.

In addition, the first substrate 26, and the conductive metal layer 30 formed on the first substrate 26 are the same as the substrate 10 and the conductive metal layer 30 explained in the first embodiment above.

The double-sided tape 140 includes: a second substrate 28 of a nano-web form; a first adhesive layer 32 that is formed on one surface of the second substrate 28 and that is attached to the other surface of the non-porous film layer 16; and a second adhesive layer 34 formed on the other surface of the second substrate 28.

In the same manner as the substrate 10 and the adhesive layer 20 described in the first embodiment above, the double-faced tape 140 is configured to include: the second substrate 28 of a nano-web form by an electrospinning method; the first adhesive layer 32 formed on one surface of the second substrate 28 by the electrospinning method; and the second adhesive layer 34 formed on the other surface of the second substrate 28 by the electrospinning method.

Further, in addition to the above-described structure, the double-sided tape 140 may be configured to include: the second substrate using a PET film; the first adhesive layer coated on one surface of the PET film; and the second adhesive layer coated on the other surface of the PET film.

In addition, any double-sided tape on both sides of which the adhesive force can occur can also be applied thereto.

In the case of the electromagnetic wave shielding sheet according to the fifth embodiment, the first substrate 26 of the nano-web form on which the conductive metal layer 30 is formed and the double-sided tape 140 that forms the adhesive layer are separately manufactured and then integrally formed through a lamination process, to thereby prevent the adhesive material from being penetrated to the first substrate 26.

Figure 7:
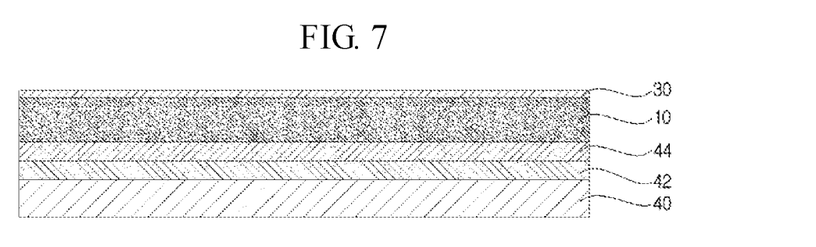
FIG. 7 is a cross-sectional view of an electromagnetic wave shielding sheet according to a sixth embodiment of the present invention.

FIG. 7 is a cross-sectional view of an electromagnetic wave shielding sheet according to a sixth embodiment of the present invention.

The electromagnetic wave shielding sheet according to the sixth embodiment includes: a substrate 10 of a nano-web form; a conductive metal layer 30 that is formed on one surface of the substrate 10 for playing a role of performing electromagnetic wave shielding performance; a first adhesive layer 44 that is laminated on the other surface of the substrate 10; and a second adhesive layer 42 that is laminated on the first adhesive layer 44.

Here, the first adhesive layer 44 is a high viscosity adhesive layer, and the second adhesive layer 42 is an adhesive layer that is of a relatively low viscosity in comparison to the first adhesive layer 44.

If the high viscosity adhesive layer is laminated on the substrate 10, an amount of the adhesive material to be absorbed into the pores 12 formed in the substrate 10 becomes relatively small, to thus facilitate maintaining the form of the substrate 10, and to accordingly strengthen the strength of the substrate 10.

Accordingly, the high viscosity first adhesive layer 44 is laminated on the surface of the substrate 10 to thus enhance the strength of the substrate 10.

Then, as the viscosity of the adhesive layer is high, the adhesive strength is lowered. In order to prevent the adhesion from lowering, a low viscosity second adhesive layer 42 is laminated on the surface of the high viscosity first adhesive layer 44, to enhance the adhesive strength.

In the case of the electromagnetic wave shielding sheet according to the sixth embodiment, the high viscosity first adhesive layer 44 is laminated on the surface of the substrate 10, to enhance the strength of the substrate 10, and the low viscosity second adhesive layer 42 is laminated on the surface of the first adhesive layer 44, to enhance the adhesive strength.

Figure 8:
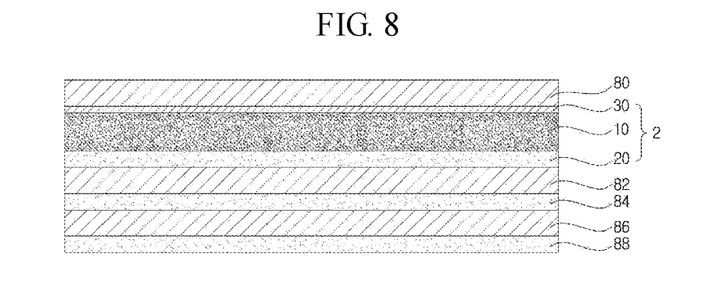
FIG. 8 is a cross-sectional view of a built-in antenna according to the present invention.

FIG. 8 is a cross-sectional view of a built-in antenna according to the present invention.

The built-in antenna according to the present invention includes: a FPCB (flexible printed circuit board) 86 in which an antenna pattern is formed; a ferrite sheet 82 that is laminated on the FPCB 86 to increase the permeability; and an electromagnetic wave shielding sheet 2 stacked on the ferrite sheet 82.

Here, a first double-sided tape 88 for attaching an antenna onto an electronic apparatus is attached to one surface of the FPCB 86, and a second double-sided tape 84 is attached between the FPCB 86 and the ferrite sheet 82 to thus adhere between the FPCB 86 and the ferrite sheet 82.

Then, a cover layer 80 for protecting the antenna is laminated on the surface of an electromagnetic shielding sheet 2.

The electromagnetic wave shielding sheet 2 may employ any one of the electromagnetic wave shielding sheets described in the first to sixth embodiments.

Figure 9:
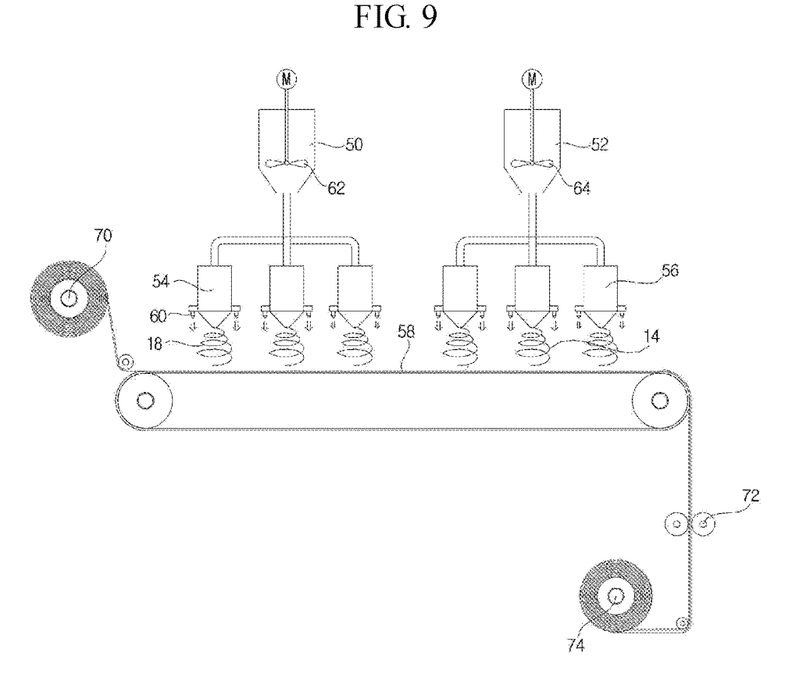
FIG. 9 is a schematic diagram of an electrospinning apparatus for manufacturing an electromagnetic wave shielding sheet according to the first embodiment of the present invention.

FIG. 9 is a schematic diagram of an electrospinning apparatus for manufacturing an electromagnetic wave shielding sheet according to the first embodiment of the present invention.

The electrospinning device according to the first embodiment of the present invention includes: a first mixing tank 50 in which a mixture of an adhesive material and a solvent is stored; a second mixing tank 52 in which a mixture of a polymer material and the solvent is stored; a first spinning nozzle unit 54 that is connected to a high voltage generator and that is connected to the first mixing tank 50, for forming an adhesive layer 20 by spinning ultra-fine fiber strands 18; a second spinning nozzle unit 56 that is connected to the high voltage generator and that is connected to the second mixing tank 52, for forming a substrate 10 by spinning ultra-fine fiber strands 14; and a collector 58 that accumulates the ultra-fine fiber strands 14 and 18 that are spun from the first spinning nozzle unit 54 and the second spinning nozzle unit 56.

The first mixing tank 50 is provided with a first agitator 62 that evenly mixes the adhesive and the solvent and maintains a constant viscosity of the adhesive material, and the second mixing tank 52 is provided with a second agitator 64 that evenly mixes the polymer material and the solvent and maintains a constant viscosity of the polymer material.

The collector 58 collects the ultra-fine fiber strands 14 and 18 that are spun from the first spinning nozzle unit 54 and the second spinning nozzle unit 56, and is formed of a conveyor that transports the adhesive layer 20 formed by the first spinning nozzle unit 54 to the second spinning nozzle unit 56 to then laminate the substrate 10 on the surface of the adhesive layer 20.

In addition, a high voltage electrostatic force of 90 to 120 Kv is applied between the collector 58 and each of the spinning nozzle units 54 and 56, to thereby spin ultra-fine fiber strands 14 and 18.

Here, the first spinning nozzle unit 54 and the second spinning nozzle unit 56 are configured to have a plurality of spinning nozzles, respectively, in which the plurality of spinning nozzles may be arranged in sequence in a chamber or may be arranged in different chambers, respectively.

The first spinning nozzle unit 54 and the second spinning nozzle unit 56 are provided with an air spray apparatus 64, respectively, to thereby spray air to the fiber strands 14 and 18 spun from the first spinning nozzle unit 54 and the second spinning nozzle unit 56 and to thus prevent the fiber strands 14 and 18 from fluttering without being smoothly collected by the collector 64.

A release film roll 70 is disposed in front of the collector 58, in which a release film 40 is wound on the release film roll 70, to allow the release film 40 to be supplied to the collector 58.

A pressure roller 80 that pressurizes the substrate 10 and the adhesive layer 20 to have a constant thickness is provided at one side of the collector 64. A sheet roll 82 is provided, around which the substrate 10 and the adhesive layer 20 pressurized via the pressure roller 80 are wound.

A process for producing the electromagnetic wave shielding sheet by using the electrospinning apparatus according to the first embodiment as described above will be described as follows.

The release film 40 is supplied from the release film roll 70 to the collector 58.

Then, a high voltage electrostatic force is applied between the collector 58 and the first spinning nozzle unit 54, and thus the adhesive material is made into ultra-fine fiber strands 18 by the first spinning nozzle unit 54 to then be spun to the top surface of the collector 58. As a result, the ultra-fine fiber strands 18 are accumulated onto the surface of the release film 40 to thus form the adhesive layer 20.

Here, when the first spinning nozzle unit 54 spins the fiber strands 18, an air spray apparatus 60 mounted in the first spinning nozzle unit 54 sprays air to the fiber strands 18, so that the fiber strands 18 can be collected and captured on the surface of the collector 58 without fluttering.

Then, when the adhesive layer 20 is completely manufactured, the collector 58 is driven so that the adhesive layer 20 is moved to the bottom of the second spinning nozzle unit 56, and when a high voltage electrostatic force is applied between the collector 58 and the second spinning nozzle unit 56, the polymer material is made into ultra-fine fiber strands 14 by the second spinning nozzle unit 56 to then be spun on the adhesive layer 20. As a result, the ultra-fine fiber strands 14 are collected onto the surface of the adhesive layer 20 to thus form the substrate 10 in a nano-web shape.

In this case, likewise, another air spray apparatus 60 mounted in the second spinning nozzle unit 56 sprays air to the fiber strands 14, so that the fiber strands 14 can be collected and captured on the surface of the adhesive layer 20 without fluttering.

In this way, the finished sheet is pressed to a predetermined thickness while passing through the pressing roller 72 and is wound on the sheet roll 74.

The sheet wound on the sheet roll 74 is moved to a place of forming the conductive metal layer 30 to then form the conductive metal layer 30 on the surface of the substrate 10 by a sputtering process. When forming the conductive metal layer 30, the substrate 10 is of the nano-web form and thus the metal material is penetrated into the pores 12 of the substrate 10, to thereby increase the amount of the metal material of the conductive metal layer 30. That is, even when the thickness of the electromagnetic wave shielding sheet is identical, the amount of the metal material of the conductive metal layer 30 can be increased to thus improve the electromagnetic wave shielding performance.

In addition, since the conductive metal layer 30 is formed on the surface of the substrate 10 of the nano-web form, a phenomenon of peeling off the conductive metal layer 30 from the substrate 10 can be prevented.

Figure 10:
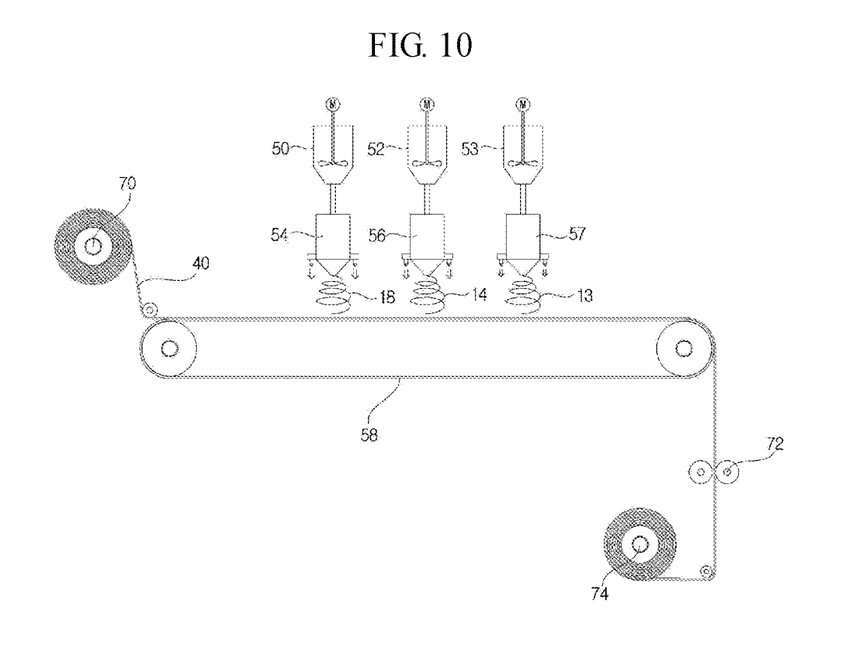
FIG. 10 is a schematic diagram of an electrospinning apparatus for manufacturing an electromagnetic wave shielding sheet according to the second embodiment of the present invention.

FIG. 10 is a schematic diagram of an electrospinning apparatus for producing an electromagnetic wave shielding sheet according to the second embodiment of the present invention.

The electrospinning device according to the second embodiment of the present invention includes: a first mixing tank 50 in which a mixture of an adhesive material and a solvent is stored; a second mixing tank 52 in which a mixture of a polymer material containing PU or TPU and the solvent is stored; a third mixing tank 53 in which a mixture of a polymer material and the solvent is stored; a first spinning nozzle unit 54 that is connected to a high voltage generator and that is connected to the first mixing tank 50, for forming an adhesive layer 20 by spinning ultra-fine fiber strands 18; a second spinning nozzle unit 56 that is connected to the high voltage generator and that is connected to the second mixing tank 52, for forming a non-porous film layer by spinning ultra-fine fiber strands 14; a third spinning nozzle unit 57 that is connected to the high voltage generator and that is connected to the third mixing tank 53, for forming a substrate 10 by spinning ultra-fine fiber strands 13; and a collector 58 that accumulates the ultra-fine fiber strands 18, 14 and 13 that are spun from the first spinning nozzle unit 54, the second spinning nozzle unit 56, and the third spinning nozzle unit 57.

A process for producing the electromagnetic wave shielding sheet by using the electrospinning apparatus according to the second embodiment as described above will be described as follows.

The release film 40 is supplied from the release film roll 70 to the collector 58.

Then, a high voltage electrostatic force is applied between the collector 58 and the first spinning nozzle unit 54, and thus the adhesive material is made into ultra-fine fiber strands 18 by the first spinning nozzle unit 54 to then be spun to the top surface of the collector 58. As a result, the adhesive layer 20 is formed on the surface of the release film 40.

Then, when the adhesive layer 20 is completely manufactured, the collector 58 is driven so that the adhesive layer 20 is moved to the bottom of the second spinning nozzle unit 56, and when a high voltage electrostatic force is applied between the collector 58 and the second spinning nozzle unit 56, the polymer material containing PU or TPU is made into ultra-fine fiber strands 14 by the second spinning nozzle unit 56 to then be spun on the adhesive layer 20. As a result, the non-porous film layer 16 is formed on the adhesive layer 20.

Then, the collector 58 is driven so that the non-porous film layer 16 is moved to the bottom of the third spinning nozzle unit 57, and when a high voltage electrostatic force is applied between the collector 58 and the third spinning nozzle unit 57, the polymer material is made into ultra-fine fiber strands 13 by the third spinning nozzle unit 57 to then be spun on the non-porous film layer 16. As a result, substrate 10 is formed on the non-porous film layer 16.

In this way, the finished sheet is pressed to a predetermined thickness while passing through the pressing roller 72 and is wound on the sheet roll 74.

Then, when forming the conductive metal layer 30 to the surface of the substrate 10, the electromagnetic wave shielding sheet is completely prepared.

Here, the non-porous film layer 16 employs a polymer material containing a rubber component that is soluble in a solvent such as PU or TPU. If the polymer material containing a rubber component that is soluble in a solvent such as PU or TPU is electrospun, the rubber component such as PU or TPU is dissolved in the solvent and then the polymer material is manufactured into a non-porous film with no pores, to thereby prevent the metal material introduced into the pores 12 formed in the substrate 10 from escaping from the pores 12.

The electromagnetic wave shielding sheet manufacturing method according to the third embodiment is the same as the manufacturing method described in the second embodiment above. However, the former differs from the latter in that in the former case, the substrate is separated into the first substrate 22 and the second substrate 24, and then, the non-porous film layer 16 is laminated between the first substrate 22 and the second substrate 24.

Figure 11:
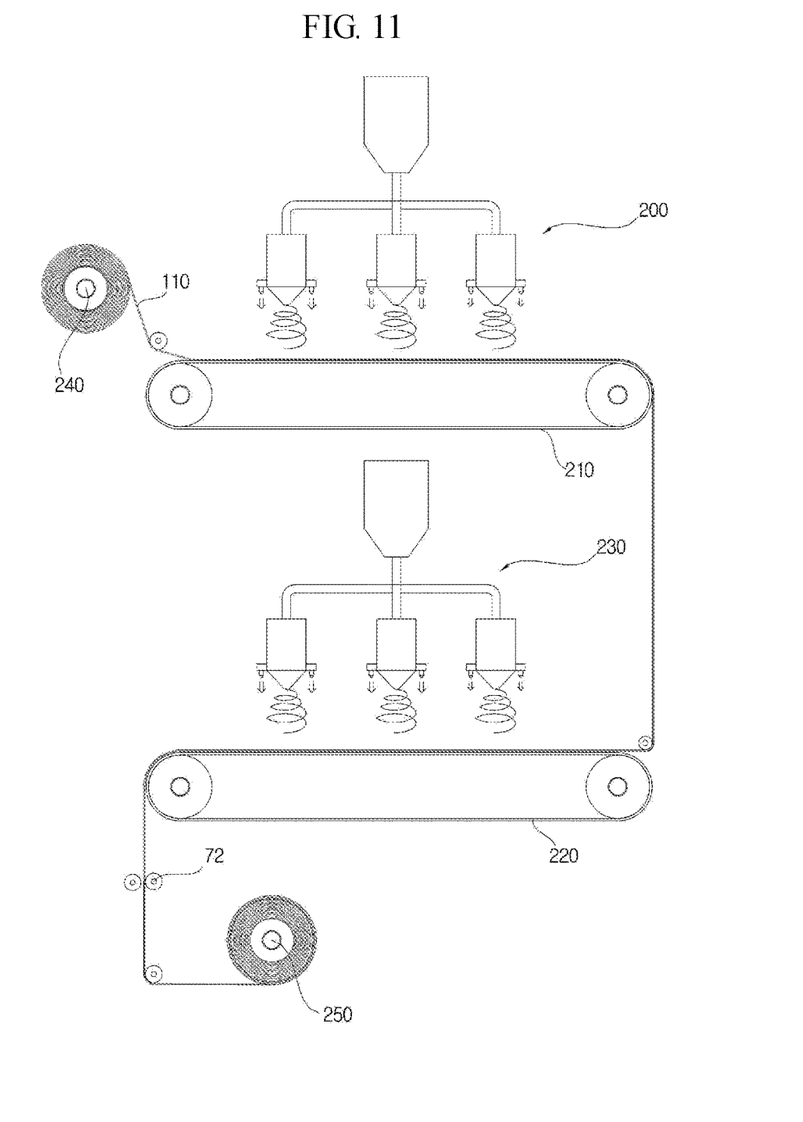
FIG. 11 is a schematic diagram of an electrospinning apparatus for manufacturing an electromagnetic wave shielding sheet according to the fourth embodiment of the present invention.

FIG. 11 is a schematic diagram of an electrospinning apparatus for producing an electromagnetic wave shielding sheet according to the fourth embodiment of the present invention.

The electrospinning apparatus according to the fourth embodiment of the present invention includes: a first spinning nozzle unit 200 for forming a substrate 10 by spinning ultra-fine fiber strands; a first collector 210 that accumulates the ultra-fine fiber strands spun from the first spinning nozzle unit 200; a second spinning nozzle unit 230 that is disposed on the lower side of the first collector 210 for forming an adhesive layer by spinning ultra-fine fiber strands; and a second collector 220 that accumulates the ultra-fine fiber strands spun from the second spinning nozzle unit 230.

Here, the first spinning nozzle unit 200 is the same as the configuration of the second spinning nozzle unit 56 for forming the substrate in the first embodiment, and the second spinning nozzle unit 230 is the same as the configuration of the first spinning nozzle unit 54 for forming the adhesive layer in the first embodiment, and thus the detailed description thereof will be omitted.

Then, a first roll 240 on which the base film 110 is wound is disposed in the front side of the first collector 210, and a second roll 250 on which the electromagnetic wave shielding sheet is wound is disposed in the rear side of the second collector 220.

A process for producing the electromagnetic wave shielding sheet by using the electrospinning apparatus according to the fourth embodiment as described above will be described as follows. First, the base film 110 is moved to the first collector 210. Here, a PET film is used as the base film 110.

Then, the first spinning nozzle unit 200 spins the polymer material onto one surface of the base film 110 to thus form a substrate 10 of a nano-web form. Then, the base film 110 on which the substrate 10 is formed is moved to the second collector 220. Here, since the second collector 220 is arranged at the lower side of the first collector 210, the base film 110 on which the substrate 10 is formed is moved to the second collector 220, at a state where the other surface of the base film 110 faces up.

In addition, the second spinning nozzle unit 230 spins the adhesive material on the other surface of the base film 110, to thus form the adhesive layer 20.

Then, the electromagnetic shielding sheet is completed by forming the conductive metal layer 30 on the substrate 10.

Hereinbelow, a method of manufacturing an electromagnetic wave shielding sheet according to the fifth embodiment of the present invention will be described. First, the polymer material containing PU or TPU is spun by using the electrospinning apparatus as explained in the first embodiment or the second embodiment, to thus form the non-porous film layer 16, and then the polymer material is spun on the non-porous film layer 16 to thus form the first substrate 26 in a nano-web form.

Then, a double-sided tape 140 is separately prepared and then the double-sided tape 140 is laminated on the non-porous film layer 16. Here, the lamination method may be performed by using a variety of methods such as a thermal compression bonding by using a compression roller.

Here, the double-sided tape 140 is configured to include: a second adhesive layer 34 that is formed by spinning an adhesive material on a release film by using the electrospinning device as shown in the first embodiment or the second embodiment; a second substrate 28 that is formed in a nano-web form by spinning a polymer material on the second adhesive layer 34, and a first adhesive layer 32 that is formed by spinning the adhesive material on the other surface of the second substrate 28.

As described above, the double-sided tape manufacturing process according to the fifth embodiment of the present invention is the same as that of using the electrospinning apparatus as explained in the second embodiment, and thus the detailed description thereof will be omitted. Finally, the electromagnetic wave shielding sheet is completed by forming a conductive metal layer 30 on the first substrate 26.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

The present invention can be attached on an inner surface of a case of an electronic device, including a variety of electronic devices such as portable terminal devices, circuitry components directly generating electromagnetic waves, or the surface of a built-in antenna, and may be applied usefully as a shielding sheet for shielding an electromagnetic wave.

What is claimed is:

1. An electromagnetic wave shielding sheet comprising:
   a substrate formed in a form of a first nano-web, the first nano-web being composed of accumulated fiber strands and having a plurality of pores, the fiber strands being made of a first polymer material and having a diameter in a range of 0.1 μm to 3.0 μm;
   a conductive metal layer formed on one surface of the substrate for shielding electromagnetic waves and made of a conductive metal material, the conductive metal material being partially introduced into the pores of the first nano-web; and
   an adhesive layer formed on the other surface of the substrate.

2. The electromagnetic wave shielding sheet according to claim 1, wherein the first nano-web is formed by any one of electrospinning, air-electrospinning (AES), electrospray, electroblown spinning, centrifugal electrospinning, and flash-electrospinning.

3. The electromagnetic wave shielding sheet according to claim 1, wherein the adhesive layer is formed in a form of a second nano-web.

4. The electromagnetic wave shielding sheet according to claim 1, wherein the adhesive layer comprises a first adhesive layer formed on the substrate and a second adhesive layer laminated on the first adhesive layer, and the first adhesive layer has a viscosity higher than that of the second adhesive layer.

5. The electromagnetic wave shielding sheet according to claim 1, further comprising a non-porous film layer that is formed between the substrate and the adhesive layer.

6. The electromagnetic wave shielding sheet according to claim 5, wherein the non-porous film layer is formed in a form of a second nano-web, the second nano-web being formed of a second polymer material containing PU (polyurethane) or TPU (thermoplastic polyurethane).

7. The electromagnetic wave shielding sheet according to claim 5, wherein the non-porous film layer is a PET (polyethylene phthalate) film.

8. The electromagnetic wave shielding sheet according to claim 5, further comprising a second substrate is formed between the non-porous film layer and the adhesive layer.

9. A built-in antenna comprising:
- a FPCB (flexible printed circuit board) in which an antenna pattern is formed;
- a ferrite sheet that is stacked on the FPCB; and
- an electromagnetic wave shielding sheet of claim 1 that is laminated on the ferrite sheet.

10. The built-in antenna according to claim 9, wherein a first double-sided tape is attached on one surface of the FPCB, and a second double-sided tape is attached between the FPCB and the ferrite sheet.

* * * * *